United States Patent
Wu et al.

(10) Patent No.: US 7,091,058 B2
(45) Date of Patent: Aug. 15, 2006

(54) SACRIFICIAL PROTECTIVE LAYER FOR IMAGE SENSORS AND METHOD OF USING

(75) Inventors: Chih-huei Wu, Sunnyvale, CA (US); Xinping He, San Jose, CA (US)

(73) Assignee: OmniVision Technologies, Inc., Sunnyvale, CA (US)

( * ) Notice: Subject to any disclaimer, the term of this patent is extended or adjusted under 35 U.S.C. 154(b) by 0 days.

(21) Appl. No.: 10/734,099

(22) Filed: Dec. 11, 2003

(65) Prior Publication Data
US 2005/0130337 A1    Jun. 16, 2005

(51) Int. Cl.
*H01L 21/00* (2006.01)
*H01L 21/44* (2006.01)

(52) U.S. Cl. .................. 438/57; 438/107
(58) Field of Classification Search ........... 438/22–38, 438/57, 58, 64–75, 106–119, 460–465
See application file for complete search history.

(56) References Cited

U.S. PATENT DOCUMENTS

| | | | | |
|---|---|---|---|---|
| 5,479,049 A | * | 12/1995 | Aoki et al. | 257/642 |
| 6,617,189 B1 | * | 9/2003 | Chen et al. | 438/48 |
| 2002/0148946 A1 | * | 10/2002 | Tu et al. | 250/208.1 |
| 2004/0082094 A1 | * | 4/2004 | Yamamoto | 438/65 |
| 2004/0135919 A1 | * | 7/2004 | Kim et al. | 348/340 |

* cited by examiner

*Primary Examiner*—Andy Huynh
*Assistant Examiner*—Calvin Lee
(74) *Attorney, Agent, or Firm*—Perkins Coie LLP

(57) ABSTRACT

A method for protecting an image sensor die is disclosed. The method comprises forming a plurality of image sensor die having micro-lenses onto a semiconductor wafer. Then, a protective layer is formed over the image sensor die. After the protective layer has been formed, and without any removal step of the protective layer, the wafer is diced to separate the plurality of image sensor die. Finally, the image sensor die are mounted onto an integrated circuit package and the protective layer is removed.

1 Claim, 4 Drawing Sheets

SACRIFICIAL PROTECTIVE LAYER FOR IMAGE SENSORS AND METHOD OF USING

TECHNICAL FIELD

The present invention relates to increasing the yield during manufacture of image sensors, and more particularly, to using a dust protective coating while dicing an image sensor wafer.

BACKGROUND

Image sensors are electronic integrated circuits that can be used to produce still or video images. Solid state image sensors can be either of the charge coupled device (CCD) type or the complimentary metal oxide semiconductor (CMOS) type. In either type of image sensor, a light gathering pixel is formed in a substrate and arranged in a two-dimensional array. Modern image sensors typically contain millions of pixels to provide a high resolution image. Formed atop each pixel is typically a micro-lens that serve to focus the incident light onto the pixels, and thus to improve the fill factor of each pixel.

In general, the manufacturing process of integrated circuit (IC) image sensors is similar to that of the vast majority of ICs. A relatively large semiconductor wafer (for example, 300 mm diameter) proceeds through a number of deposition, etching, masking, cleaning, and other steps in order to form devices onto the wafer. Moreover, it is not uncommon for hundreds, if not thousands, of discrete IC die to be formed on a single wafer. When the IC die have been fully formed, the wafer is sliced (referred to as dicing) along scribe lines formed in the wafer to separate the individual IC die from one another. After the individual IC die have been separated, the IC die are then mounted onto a package using a die bonding process.

The process of dicing the wafer invariably will result in some amount of particulate matter to be generated that is undesirably deposited onto the micro-lens surface of the IC die. While a cleaning step (using a gas or liquid) is typically performed to remove the particulates, this is still not sufficient to remove all of the particulates. This results in a reduced yield. Further, the cleaning process increases complexity and cost.

DETAILED DESCRIPTION

The present invention relates to a method of forming and packaging an image sensor that is conducive to increasing yield from a semiconductor wafer. In the following description, numerous specific details are provided to provide a thorough understanding of the embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout the specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout the specification are not necessarily all referring to the same embodiment. Furthermore, the particular features, structures, or characteristics may be combined in any suitable manner in one or more embodiments.

Figure 1:
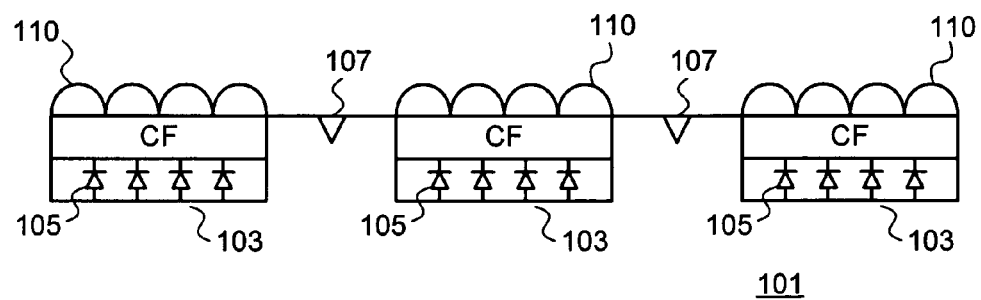
FIG. 1 is a prior art cross-sectional view of a portion of a wafer including a plurality of image sensors.

FIG. 1 shows a prior art cross-sectional simplified diagram of an image sensor wafer 101 having a plurality of individual image sensors 103. The image sensors 103 each have micro-lenses 110 formed thereon. As seen in FIG. 1, the image sensor 103 includes a plurality of pixels that have light detecting elements 105 formed in the substrate. The light detecting elements 105 may be one of several types, such as a photodiode, a photogate, or other solid state light sensitive element.

Formed atop of each pixel is a micro-lens 110. The micro-lens 110 focuses incident light onto the light detecting elements 105. Micro-lenses 110 are often formed by spin coating a layer of micro-lens material onto a planarized layer. The micro-lens material is then etched to form cylindrical or other shaped regions that are centered above each pixel. Then, the micro-lens material is heated and reflowed to form a convex hemispherical micro-lens 110.

Moreover, in the region between the light detecting elements 105 and the micro-lens 110, there are various intervening layers that would typically include the color filter layers (CF) and various metal conducting lines. It can be appreciated that the structure of FIG. 1 is merely one example of an image sensor structure and that the present invention is adaptable to any number of variants. Finally, between the individual image sensors 103 are scribe lines 107. These scribe lines identify where the semiconductor wafer should be diced in order to separate the individual die.

Figure 2:
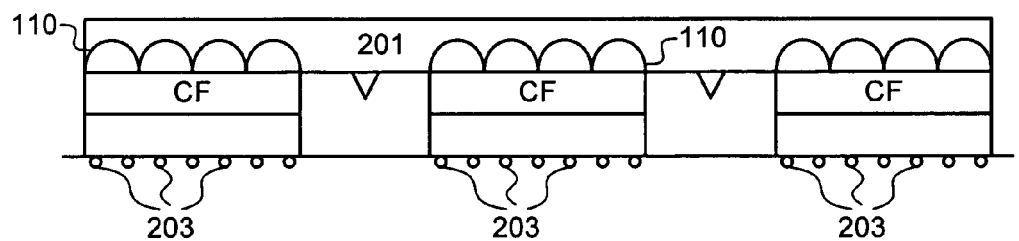
FIG. 2 is a cross-sectional view of an image sensor having a protective coating layer formed thereon.

Next, turning to FIG. 2, a sacrificial layer 201 is deposited over the micro-lenses 110. In one embodiment, the sacrificial layer 201 is over the micro-lenses 110, but in other embodiments, the sacrificial layer 201 should simply be the top most layer deposited just prior to dicing of the wafer. For example, in some image sensors, the micro-lenses 110 are not the top most layer, but rather may include other layers, such as color filter layers or passivation layers.

In one embodiment, the sacrificial layer 201 is a phenyl resin or an epoxy layer that is blanket deposited or otherwise formed over the entire wafer, spanning across multiple image sensor die. The thickness of the sacrificial layer 201 is not crucial; however, the sacrificial layer 201 should be thick enough to adequately protect the underlying micro-lenses 110 and withstand subsequent handling. In one embodiment, the sacrificial layer 201 is between 1–3 microns thick.

According to one embodiment of the present invention, the sacrificial layer 201 is spin coated over the top most layer. The sacrificial layer 201 in one embodiment is polyglycidylmethylacrylate (PGMA) or polymethylmethylacrylate (PMMA). However, other types of materials may be substituted, but preferably materials that may be spun on and subsequently cured into a solid. Note that for ease of manufacturing process, the entire wafer is coated with the protective coating 201.

Because the sacrificial layer 201 covers the entire top surface of the wafer, there is no need for etching of the sacrificial layer 201. Specifically, as seen in FIG. 2, the present invention is contemplated for use with a ball grid array (BGA) system 203 for electrical connections to the integrated circuit package. Therefore, there is no need to expose any of the top surface of the image sensor wafer. The use of a ball grid array (BGA) system 203, coupled with the sacrificial layer 201, provide increased yield and yet still lower manufacturing complexity.

Figure 3:
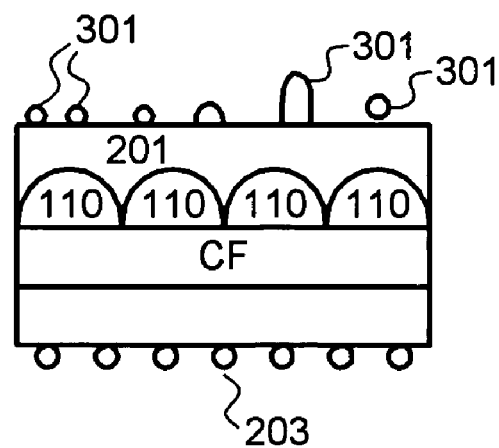
FIG. 3 is a cross-sectional view of an image sensor having a protective coating layer formed thereon and dust particles on the protective coating layer due to an assembly process.

After the sacrificial layer 201 has been deposited, the wafer can now be assembled. This generally includes the steps of dicing the wafer and attaching the wafer to the integrated circuit package. Note that the sacrificial layer 201 is not etched or otherwised removed prior to dicing of the wafer. This provides greater protection and manufacturing ease. FIG. 3 shows an image sensor after the image sensor die 103 have been diced. Note that various particulates 301 may deposit onto the sacrificial layer 201. Because of the sacrificial layer 201, the particulates 301 do not fall onto the micro-lenses of the image sensor.

Figure 4:
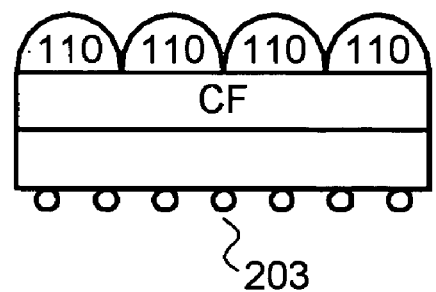
FIG. 4 is a cross sectional view of an image sensor having the protective coating layer removed.

Next, as seen in FIG. 4, the sacrificial layer 201 and the particulates 301 are removed, such as by a wet step. For example, in the case of a phenyl resin, the sacrificial layer 201 can be removed using a wet chemical process. Alternatively, various types of etching may be utilized. In one embodiment, the removal of the sacrificial layer 201 should be tailored to the removal of the material constituting the sacrificial layer 201, with little or no damage to the IC package and other components. Various techniques are known in the art for performing this removal, including but not limited to a wet chemical process.

Figure 5:
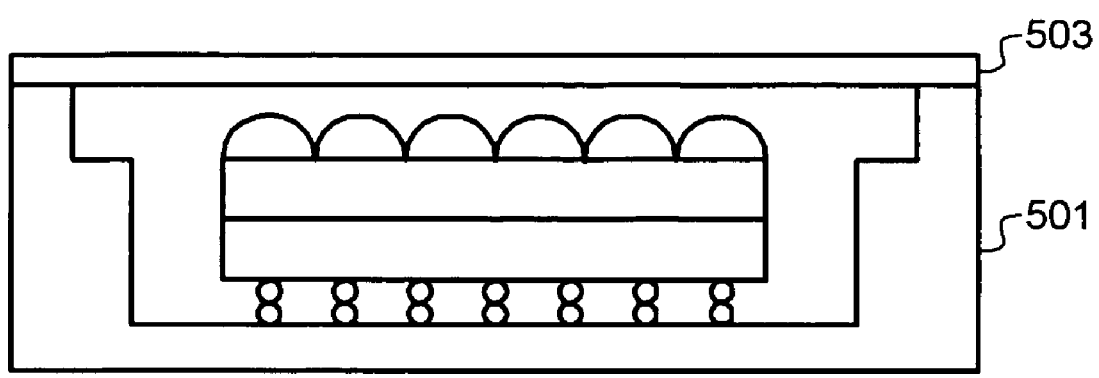
FIG. 5 is a schematic illustration of an image sensor die formed in accordance with the present invention mounted onto an integrated circuit package and protected with a glass lid.

Finally, as seen in FIG. 5, the image sensor die is mounted onto an IC package 501. Further, a glass lid 503 is mounted onto the IC package 501 to protect the image sensor from any damage.

Figure 6:
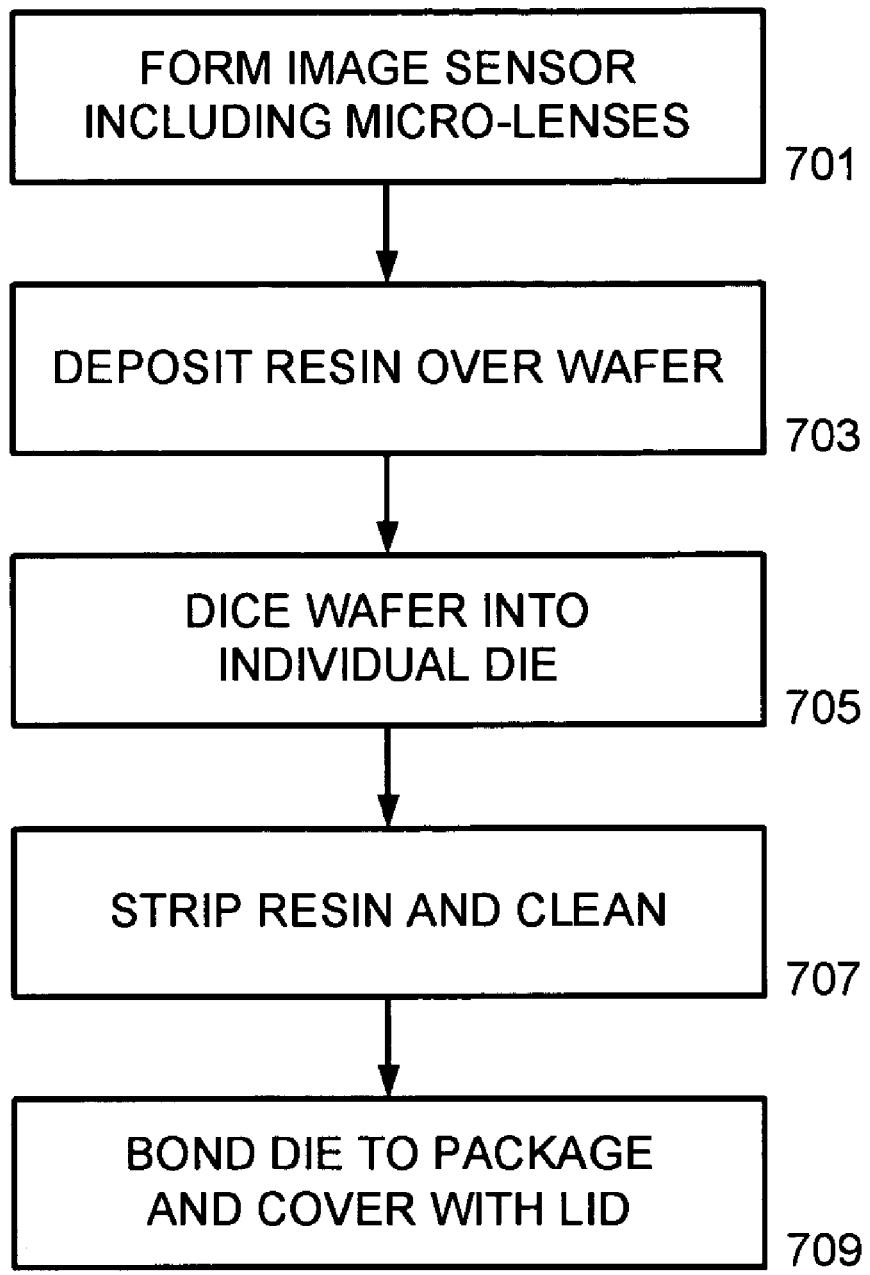
FIG. 6 is flow diagram illustrating the method of one embodiment of the present invention.

FIG. 6 illustrates a flow diagram showing the method of the present invention. First, at box 701, the image sensor die 103 are formed (including formation of the color filters and micro-lenses). Next, at box 703, the sacrificial layer 201 (such as resin) is deposited over the wafer. At box 705, the wafer is diced to separate the individual image sensor die 103 from each other. At box 707, the protective layer 201 is removed, such as by wet stripping. The image sensor die 103 are also cleaned using conventional techniques. Once this has been done, the image sensor die 103 are then mounted onto an IC package 501 at box 709 and a glass lid 503 is used to seal the package.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method comprising:

forming a plurality of image sensor die having micro-lenses onto a semiconductor wafer, wherein said image sensor die uses a ball grid array (BGA) on the underside of said die;

forming a protective layer over said image sensor die;

dicing said wafer to separate said plurality of image sensor die;

mounting said image sensor die onto an integrated circuit package, the BGA being positioned between the die and the integrated circuit package to electrically connect the die to the integrated circuit package; and removing said protective layer from said image sensor die.

\* \* \* \* \*